United States Patent
Hersam et al.

(10) Patent No.: US 11,057,994 B2
(45) Date of Patent: Jul. 6, 2021

(54) CONDUCTIVE GRAPHENE INTERFACIAL BARRIERS FOR LIQUID METAL ELECTRONICS

(71) Applicants: NORTHWESTERN UNIVERSITY, Evanston, IL (US); GOVERNMENT OF THE UNITED STATES, AS REPRESENTED BY THE SECRETARY OF THE AIR FORCE, Wright-Patterson Air Force Base, OH (US)

(72) Inventors: Mark C. Hersam, Wilmette, IL (US); Ethan B. Secor, Stillwater, MN (US); Alexander B. Cook, Beavercreek, OH (US); Christopher Tabor, Wright-Patterson Air Force Base, OH (US)

(73) Assignees: NORTHWESTERN UNIVERSITY, Evanston, IL (US); GOVERNMENT OF THE UNITED STATES, AS REPRESENTED BY THE SECRETARY OF THE AIR FORCE, Wright-Patterson Air Force Base, OH (US)

( * ) Notice: Subject to any disclaimer, the term of this patent is extended or adjusted under 35 U.S.C. 154(b) by 0 days.

(21) Appl. No.: 16/648,275

(22) PCT Filed: Oct. 3, 2018

(86) PCT No.: PCT/US2018/054193
§ 371 (c)(1),
(2) Date: Mar. 18, 2020

(87) PCT Pub. No.: WO2019/070872
PCT Pub. Date: Apr. 11, 2019

(65) Prior Publication Data
US 2020/0229304 A1    Jul. 16, 2020

Related U.S. Application Data

(60) Provisional application No. 62/567,434, filed on Oct. 3, 2017.

(51) Int. Cl.
*H05K 1/09*    (2006.01)
*H05K 1/02*    (2006.01)
(Continued)

(52) U.S. Cl.
CPC ........... *H05K 1/092* (2013.01); *H05K 1/0277* (2013.01); *H05K 1/0292* (2013.01); *H05K 1/032* (2013.01);
(Continued)

(58) Field of Classification Search
CPC ........ H05K 1/092; H05K 1/03; H05K 3/1283; H05K 2203/1194; H05K 2203/128;
(Continued)

(56) References Cited

U.S. PATENT DOCUMENTS 9,079,764 B1    7/2015  Hersam et al.
9,704,964 B1 *  7/2017  Ordonez ................. H01L 29/45
(Continued)

FOREIGN PATENT DOCUMENTS

JP    2015024937 A    2/2015
WO   2016175195 A1   11/2016

OTHER PUBLICATIONS

L. Hu, L. Wang, Y. Ding, S. Zhan, J. Liu, Adv. Mater. 2016, 28, 9210.
(Continued)

*Primary Examiner* — Hoa C Nguyen
(74) *Attorney, Agent, or Firm* — Locke Lord LLP; Tim Tingkang Xia, Esq.

(57) ABSTRACT

Articles, electronic devices and related methods of fabrication interfacing graphene with a gallium liquid metal alloy.

31 Claims, 13 Drawing Sheets

(51) Int. Cl.
   *H05K 1/03* (2006.01)
   *H05K 1/16* (2006.01)
   *H05K 3/12* (2006.01)

(52) U.S. Cl.
   CPC ............. *H05K 1/16* (2013.01); *H05K 3/1283* (2013.01); *H05K 2201/0154* (2013.01); *H05K 2201/0323* (2013.01); *H05K 2201/10053* (2013.01); *H05K 2203/1194* (2013.01)

(58) Field of Classification Search
   CPC .......... C09D 5/24; C09D 11/00; C09D 11/02; C09D 11/34; C09D 101/02
   See application file for complete search history.

(56) References Cited

U.S. PATENT DOCUMENTS

| | | | |
|---|---|---|---|
| 9,834,693 | B2 | 12/2017 | Hersam et al. |
| 9,840,634 | B2 | 12/2017 | Hersam et al. |
| 2010/0035061 | A1* | 2/2010 | Mason .................. G03F 7/40 428/403 |
| 2012/0082787 | A1 | 4/2012 | Fujita |
| 2012/0161113 | A1* | 6/2012 | Lowenthal ........... H01L 25/048 257/40 |
| 2012/0320581 | A1* | 12/2012 | Rogers .................. H01L 24/24 362/235 |
| 2014/0220238 | A1* | 8/2014 | Abbel .................. H05K 1/092 427/122 |
| 2015/0072162 | A1 | 3/2015 | Hersam et al. |
| 2015/0122659 | A1 | 5/2015 | Kula et al. |
| 2017/0287663 | A1* | 10/2017 | Ekambaram ......... H01H 29/04 |
| 2018/0148584 | A1* | 5/2018 | Chu ..................... H05K 1/095 |
| 2019/0067690 | A1* | 2/2019 | Chen ..................... H01G 11/00 |

OTHER PUBLICATIONS

R. C. Ordonez, C. K. Ha Yashi, C. M. Torres, N. Hafner, J. R. Adleman, N. M. Acosta, J. Melcher, N. M. Kamin, D. Garmire, IEEE Trans Electron Devices 2016, 63, 4018.

E. B. Secor, P. L. Prabhumirashi, K Puntambekar, M. L. Geier, M. C. Hersam, J. Phys. Chem. Lett. 2013, 4, 1347.

E. B. Secor, M. C. Hersam, J. Phys. Chem. Lett. 2015, 6, 620.

E. B. Secor, B. Y. Ahn, T. Z. Gao, J. A. Lewis, M. C. Hersam, Adv. Mater. 2015, 27, 6683.

E. B. Secor, T. Z. Gao, A. E. Islam, R. Rao, S. G. Wallace, J. Zhu, K. W. Putz, B. Maruyama, M. C. Hersam, Chem. Mater. 2017, 29, 2332.

Korean Intellectual Property Office (ISR/KR), "International Search Report for PCT/US2018/054193", Korea, Feb. 1, 2019.

* cited by examiner

CONDUCTIVE GRAPHENE INTERFACIAL BARRIERS FOR LIQUID METAL ELECTRONICS

This application claims priority to and the benefit of application Ser. No. 62/567,434 filed Oct. 3, 2017—the entirety of which is incorporated herein by reference.

This invention was made with Government support from the U.S. Air Force. The Government of the United States has the right to practice or have practiced on behalf of the United States this subject invention throughout the world.

Gallium-based liquid metal alloys (GaLMAs) are a unique class of advanced materials with the potential to offer unprecedented opportunities in stretchable and reconfigurable electronics. As room temperature liquids with metallic conduction, GaLMAs present mechanical properties unmatched by conventional electronic materials. By leveraging these unique characteristics, researchers have recently demonstrated advances in reconfigurable, responsive, and stretchable electronic devices. Select applications of liquid metals include soft electronic skins, dynamic and flexible antennas, and self-healing and elastic electronics. Moreover, the fluid nature of GaLMAs such as eutectic gallium-indium (eGaIn) enables broad process compatibility with additive printing methods such as direct write, inkjet, transfer, and 3D printing. As such, research towards the control and integration of GaLMAs for printed, stretchable, and reconfigurable electronics has attracted broad scientific and practical interest.

Despite their promise, the development of liquid metal electronics must overcome several challenges for widespread application. In particular, stable electrical contacts have been identified as a critical challenge for the integration of GaLMAs in electronic circuits and systems. Since gallium alloys rapidly with most metals, GaLMAs lead to unstable or mechanically sensitive interfaces when combined with metal electrodes or interconnects, thereby preventing the reliable integration of eGaIn functionality with conventional electronics. Therefore, to enable broader application of eGaIn with conventional circuits, interfacial alloying needs to be suppressed without compromising electrical or mechanical properties.

SUMMARY OF THE INVENTION

In light of the foregoing, it is an object of the present invention to provide electronic articles, devices and/or related methods for use and/or assembly, thereby overcoming various deficiencies and shortcomings of the prior art, including those outlined above. It will be understood by those skilled in the art that one or more aspects of this invention can meet certain objectives, while one or more other aspects can meet certain other objectives. Each objective may not apply equally, in all its respects, to every aspect of this invention. As such, the following objects can be viewed in the alternative with respect to any one aspect of this invention.

It can be an object of the present invention to provide a graphene-directed solution for the stable integration of gallium-based liquid metal alloys in electrical circuits.

It can be another object of the present invention to utilize graphene-cellulose compositions as interfacial barrier components between such alloys and electrical contacts.

It can be another object of the present invention, alone or in conjunction with one or more of the preceding objectives, to provide a reliable, economical and scalable approach to liquid metal electronics to better utilize the benefits and advantages available through gallium-based liquid metal alloys.

Other objects, features, benefits and advantages of the present invention will be apparent from this summary and the following descriptions of certain embodiments, and will be readily apparent to those skilled in the art having knowledge of various gallium-based liquid metal alloys, electronic devices and related assembly/fabrication techniques. Such objects, features, benefits and advantages will be apparent from the above as taken into conjunction with the accompanying examples, dated from figures and all reasonable inferences to be drawn therefrom, alone or with consideration of the references incorporated herein.

In part, the present invention can be directed to an article of manufacture as can comprise a gallium liquid metal alloy component coupled to a graphene component comprising graphene and at least one of a cellulosic dispersing agent and an annealation product thereof. Without limitation, such a cellulosic dispersing agent can be selected from ethyl cellulose and nitrocellulose dispersing agents.

In certain embodiments, such a gallium alloy component can comprise gallium and indium. In certain such embodiments, such a gallium alloy component can be an eutectic gallium-indium liquid metal alloy. Regardless, an article can comprise a metallic component coupled to such a gallium liquid metal alloy component with such a graphene component. Such a metallic component can be an electrically conductive metal. In certain such embodiments, such a metal can be silver. As a separate consideration, such an article can be incorporated into an electronic device.

In part, the present invention can also be directed to an electronic device. Such a device can comprise an electrically-conductive metal component coupled to a substrate, a gallium-indium liquid metal alloy component coupled to such a metal component with a nanodimensioned graphene component, such a graphene component as can comprise graphene and at least one of a cellulosic dispersing agent and an annealation product thereof. Without limitation, such a cellulosic dispersing agent can be selected from ethyl cellulose and nitrocellulose dispersing agents. In certain such embodiments, such a gallium-indium liquid metal alloy can be eutectic in composition and, independently, such a metal component can be silver. Regardless, such an electronic device can comprise a flexible substrate known in the art, such as, but not limited to, a polyimide substrate.

In part, the present invention can also be directed to a reconfigurable electronic device. Such an electronic device can comprise a liquid metal circuit switch comprising opposed metal electrode components coupled to a substrate, such electrode components as can have a voltage thereacross; a graphene component coupled to each electrode component and comprising graphene and at least one of a cellulosic dispersing agent and an annealation product thereof; and a mobile gallium-indium liquid metal alloy component arranged and configured between and coupled to such electrode(s) with such a graphene component, whereby such a metal alloy component can contact one such electrode and open such a circuit, and whereby reconfiguration of such a metal alloy component can contact both electrodes and close such a circuit.

In certain embodiments, such a cellulosic dispersing agent can be selected from ethyl cellulose and nitrocellulose dispersing agents. In certain such embodiments, such a gallium-indium alloy can be eutectic and, independently, such metal electrode components can be silver. Regardless, such a substrate can be flexible. Without limitation, such a substrate can comprise a polyimide.

In part, the present invention can also be directed to a method of using a graphene composition to facilitate stable electrical connection with a gallium liquid metal alloy. Such a method can comprise providing a substrate having an electrically conductive metal component coupled thereto; contacting a graphene composition with such a metal component to provide a metal-graphene junction, such a composition as can comprise at least one of a cellulosic dispersing agent and an annealation product thereof; and contacting a gallium liquid metal alloy with such a graphene composition, to provide a graphene-gallium alloy junction and an electrically conductive component between such a metal and an alloy, thereby inhibiting, suppressing and/or modulating alloy formation with such a metal component. As discussed above and illustrated elsewhere herein, such a gallium alloy can comprising gallium and indium; in certain such embodiments, such an alloy component can be eutectic in composition. Regardless, such a metal component can comprise silver.

In certain embodiments, such a graphene component can be annealed. In certain such embodiments, such a component can be annealed at a temperature from about 250° C. to about 350° C. In certain such embodiments, where such an alloy has a line configuration, an aspect ratio of such an alloy line decreases with increasing annealation temperature. Regardless, the resistance of such a silver-graphene-eutectic gallium-indium junction can be, by comparison, less than either the resistance of a silver-graphene junction or the resistance of a graphene-eutectic gallium-indium junction.

Separately, without limitation, such a graphene composition can be a graphene ink as can comprise a dispersing agent selected from an ethyl cellulose and a nitrocellulose. In certain such embodiments, contact of such a graphene ink can be selected from various printing or application techniques known in the art including but not limited to inkjet printing, screen printing, aerosol jet printing, gravure printing and blade-coating.

DETAILED DESCRIPTION OF CERTAIN EMBODIMENTS

In accordance with certain non-limiting embodiments, the present invention can utilize a graphene composition as a reliable and high performance interfacial layer to enable electrical connections to eGaIn. In contrast to conventional metals, $sp^2$-bonded carbon materials are stable to alloy formation with liquid metals. (See, L. Hu, L. Wang, Y. Ding, S. Zhan, J. Liu, *Adv. Mater.* 2016, 28, 9210; R. C. Ordonez, C. K. Ha Yashi, C. M. Torres, N. Hafner, J. R. Adleman, N. M. Acosta, J. Melcher, N. M. Kamin, D. Garmire, *IEEE Trans. Electron Devices* 2016, 63, 4018.) To leverage this property in a platform that is suitable for printed GaLMAs, graphene inks comprising a cellulosic polymer are used for robust contacts to liquid metal. This class of graphene inks has shown broad process compatibility with excellent electrical conductivity, mechanical durability, and environmental stability. (See, E. B. Secor, P. L. Prabhumirashi, K. Puntambekar, M. L. Geier, M. C. Hersam, *J. Phys. Chem. Lett.* 2013, 4, 1347; E. B. Secor, M. C. Hersam, *J. Phys. Chem. Lett.* 2015, 6, 620; E. B. Secor, B. Y. Ahn, T. Z. Gao, J. A. Lewis, M. C. Hersam, *Adv. Mater.* 2015, 27, 6683; E. B. Secor, T. Z. Gao, A. E. Islam, R. Rao, S. G. Wallace, J. Zhu, K. W. Putz, B. Maruyama, M. C. Hersam, *Chem. Mater.* 2017, 29, 2332.) For instance, a thin (~100 nm) film of graphene printed between conventional silver leads and eGaIn acts as a physical barrier, effectively passivating the surface against alloying while retaining the ability to conduct current across the interface. Moreover, graphene interfacial contacts offer excellent durability, with thermal stability to 300° C., robust tolerance to mechanical bending, and chemical inertness. By leveraging this unique strategy to stabilize liquid metal contacts, a reconfigurable liquid metal device is fabricated with significantly improved longevity.

Figure 1A:
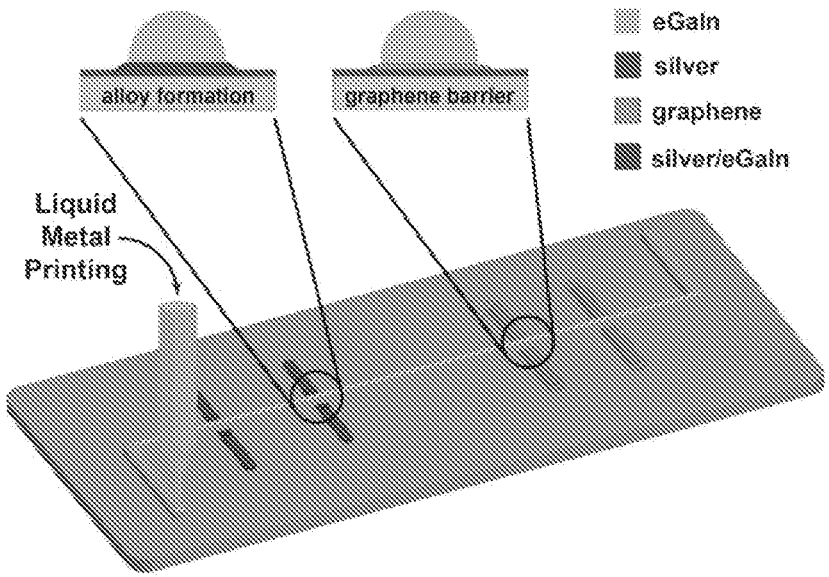
FIGS. 1A-C. Proof of concept demonstration of graphene as a stable interfacial material for eGaIn. (A) Schematic of the test setup, showing eGaIn printed over exposed and graphene-covered silver lines, with alloy formation occurring for the silver-eGaIn interface. (B) Optical microscopy image showing formation of the silver-eGaIn alloy resulting in large defects. (C) Optical microscopy image showing a silver-graphene-eGaIn configuration, with no alloy formation evident.
Figure 1B:
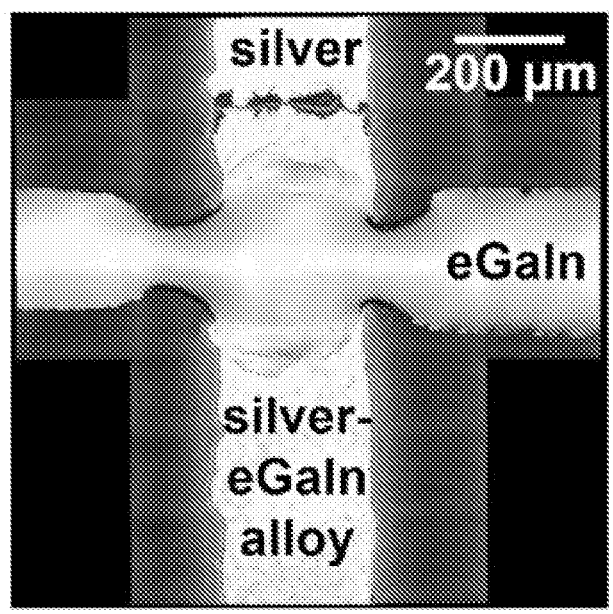
Figure 1C:
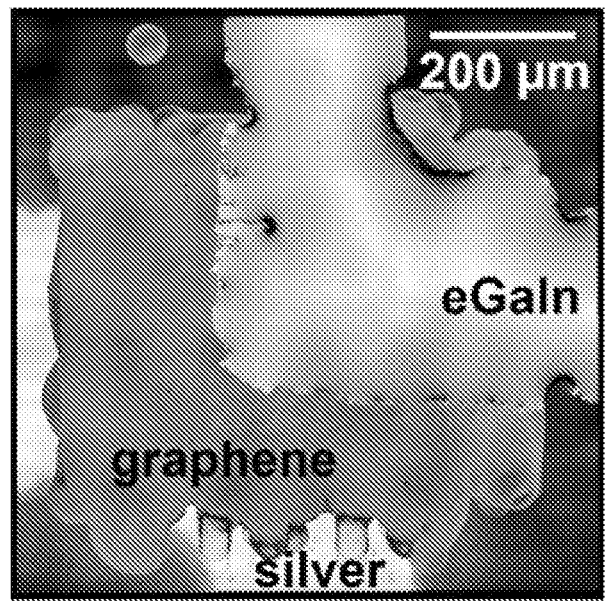

To demonstrate the utility of graphene as a conductive interfacial layer, circuits are printed with silver, graphene, and eGaIn. For the control sample, eGaIn lines are printed directly on top of silver traces (FIGS. 1A-B). This configuration exhibits clear alloying between the silver and eGaIn, as expected from prior reports. To establish the ability of graphene to stabilize this interface, a similar sample is fabricated with a thin film (~100 nm) of graphene printed between the silver and eGaIn. In this configuration, no alloy formation is observed (FIGS. 1A and 1C). These samples are further analyzed by optical profilometry to confirm the stability of the graphene interface (FIG. 2).

Figure 3A:
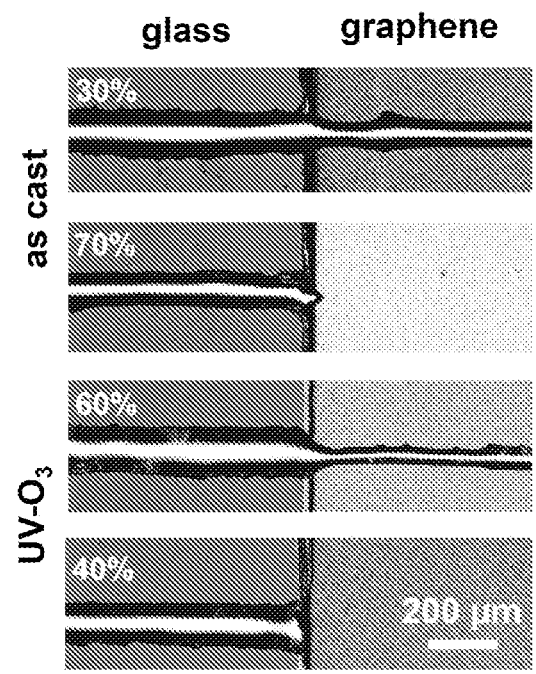
FIGS. 3A-D. Process development for the integration of eGaIn with graphene. (A) Optical microscopy images showing printed tracks of eGaIn (horizontal lines) across a bare glass-graphene film boundary (left: glass; right: graphene), for graphene films as cast (top) and following annealing at 300° C. with oxidative surface treatment (bottom). In both cases, the printing reliability was poor, with the yield indicated in each image.
(B) Corresponding printing tests following annealing of the graphene films at 250-350° C., in which stable wetting of the eGaIn was achieved to print continuous lines. (C) Large-scale photograph of liquid metal printed onto graphene, showing excellent reliability over a large area with proper graphene treatment conditions. (D) Aspect ratio of printed eGaIn lines on glass and graphene, showing a systematic trend of decreasing aspect ratio, associated with improved wetting and adhesion, for graphene films annealed at higher temperatures. Printing yield in (A) and (B) is for 5-10 lines at each condition.
Figure 3B:
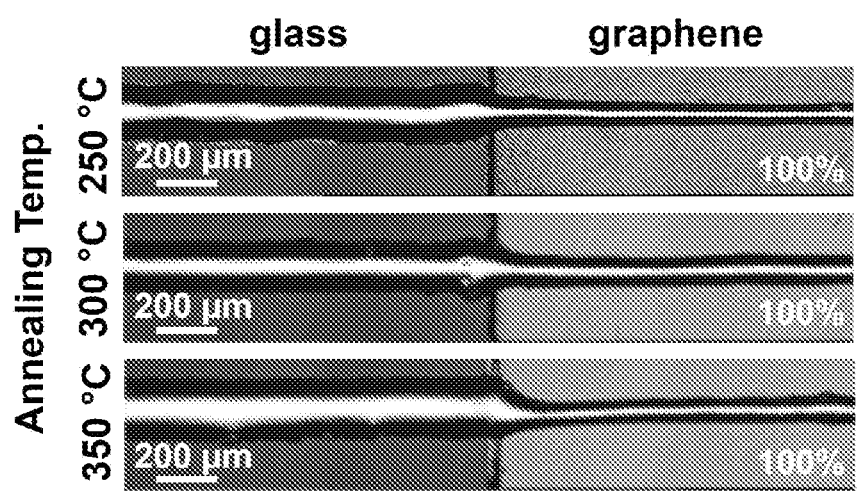
Figure 3C:
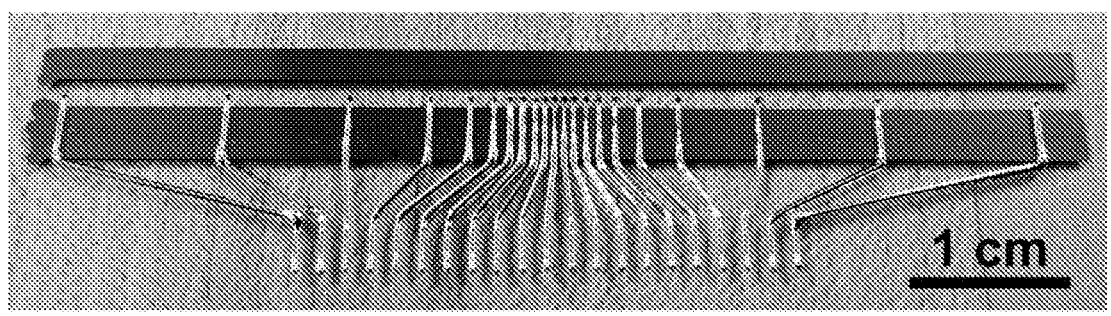

Because graphene offers substantial benefit for electrical connections in printed liquid metal electronics, the development of reliable and controlled processing methods to integrate these materials is desired. Without limitation to any one theory or mode of operation, the high surface energy of eGaIn and rapid formation of a surface oxide endow it with unconventional rheological behavior compared to traditional printed materials. For example, reliable direct-write printing of eGaIn requires tailoring of the substrate surface properties to ensure adequate and stable adhesion of $GaO_x$, which can be sensitive to humidity, surface energy, and roughness. This challenge is illustrated in FIG. 3A, which shows optical microscopy images of eGaIn printed across a glass-graphene film boundary with contrasting behavior between the two surfaces. When deposited directly onto as-cast graphene or films following oxidative surface treatment, the liquid metal traces show insufficient adhesion for stable pattern formation. For as-cast graphene films, 7 of 10 attempts to print liquid metal over the glass-graphene boundary resulted in broken lines. Similarly, for films following annealing and oxidative treatment, 2 of 5 attempts failed to achieve continuous lines. On the other hand, successful control over eGaIn wetting and adhesion was achieved by annealing the graphene films and printing eGaIn directly, without oxidative treatment. In this scenario, shown in FIG. 3B, residue from a cellulosic polymer dispersant in the graphene ink may remain on the surface, resulting in continuous lines for 25 of 25 printed samples. This reliability is shown in FIG. 3C, which illustrates consistent printing of eGaIn onto a graphene film.

Figure 3D:
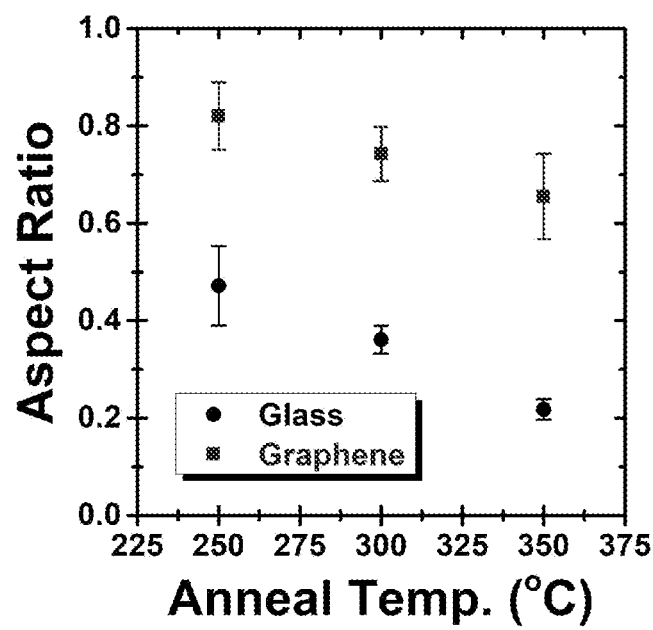

Moreover, by varying the annealing conditions between 250° C. and 350° C. to partially decompose a polymer dispersant of the graphene ink, the wetting properties of eGaIn on the graphene surface was further tailored (FIGS. 4-7). Quantification of this set of experiments is achieved by calculating the aspect ratio of eGaIn lines printed on glass and graphene (FIG. 3D). The aspect ratio, defined as line thickness divided by line width, is an indicator of the wetting behavior of the eGaIn (with all printing parameters except the graphene annealing temperature remaining constant), and decreases following higher temperature heat treatment from 250° C. to 350° C. This result is consistent with previous work showing the decomposition and structural change of the graphene ink binder residue over this temperature range, and suggests that some residual polymer annealation/decomposition products are desirable to maintain optimal printing of the liquid metal.

Figure 8:
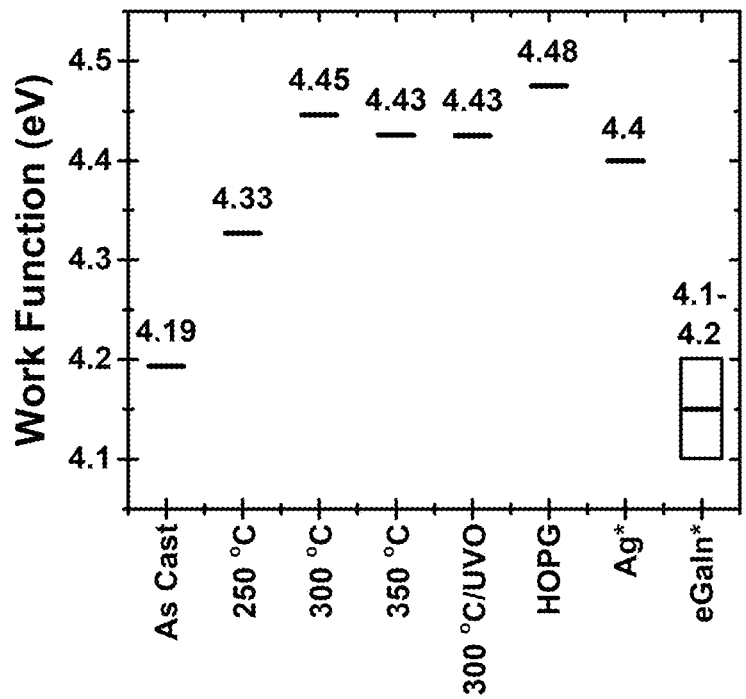
FIG. 8. Work function of graphene films with different treatment conditions, measured by Kelvin probe. HOPG, Ag, and eGaIn work functions are included from literature reports for reference.
Figure 9A:
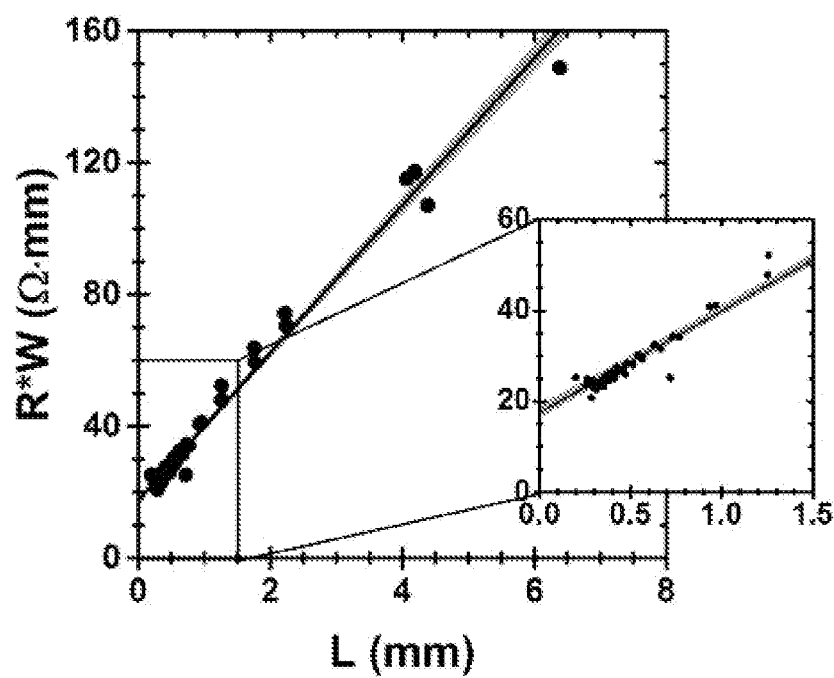
FIGS. 9A-C. Electrical characterization of graphene interfaces. (A) Contact resistance measurement for a graphene-eGaIn junction using the transmission line method. (B) Summary of contact resistances for three junction configurations, namely silver-graphene, eGaIn-graphene, and silver-graphene-eGaIn. The reduced contact resistance in the silver-graphene-eGaIn configuration is likely a result of current crowding for the individual silver-graphene and graphene-eGaIn junctions. (C) Normalized electrical resistance of silver-graphene-eGaIn junctions following thermal treatment, showing stable performance up to 300° C.
Figure 9B:
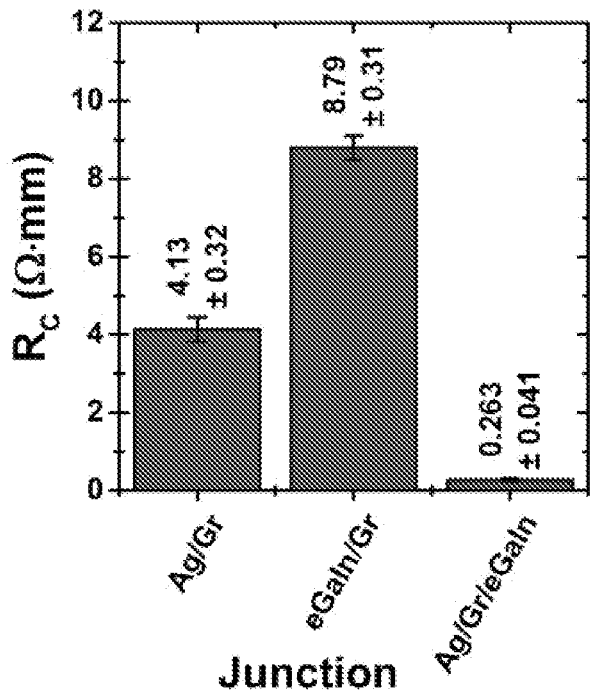

Having established suitable conditions for process integration of graphene and eGaIn, the electrical properties of the interface are characterized. As a first step, the work function of the graphene is measured to be 4.43 eV by Kelvin probe (FIG. 8), which is close to that of highly oriented pyrolytic graphite (4.48 eV). This work function value is similar to both silver (4.4 eV) and eGaIn (4.1-4.2 eV), and is therefore promising for achieving low interfacial resistance, which is a key property for many applications. The contact resistance for the graphene-eGaIn junction is measured by the transmission line method, shown in FIG. 9A. This method is also used to measure contact resistance for different material sets, as shown in FIG. 9B. The individual silver-graphene and graphene-eGaIn junctions possess contact resistances of 4.13±0.32 and 8.79±0.31 Ω·mm, respectively. In a potentially more practical configuration, the junction resistance was also measured for the three-material sample containing a silver-graphene-eGaIn junction, in which the graphene prevents alloy formation between silver and eGaIn. In this case, the graphene functions as a thin (~100 nm), conductive interfacial barrier, and the measured junction resistance is substantially lower at 0.263±0.041 Ω·mm. The higher resistance measured for silver-graphene and graphene-eGaIn junctions is likely a result of current crowding, due to the large mismatch in conductivity between the materials. For the silver-graphene-eGaIn junction, current crowding is mitigated by the comparable conductivity of silver and eGaIn, with the more resistive graphene acting as an interfacial barrier.

Figure 9C:
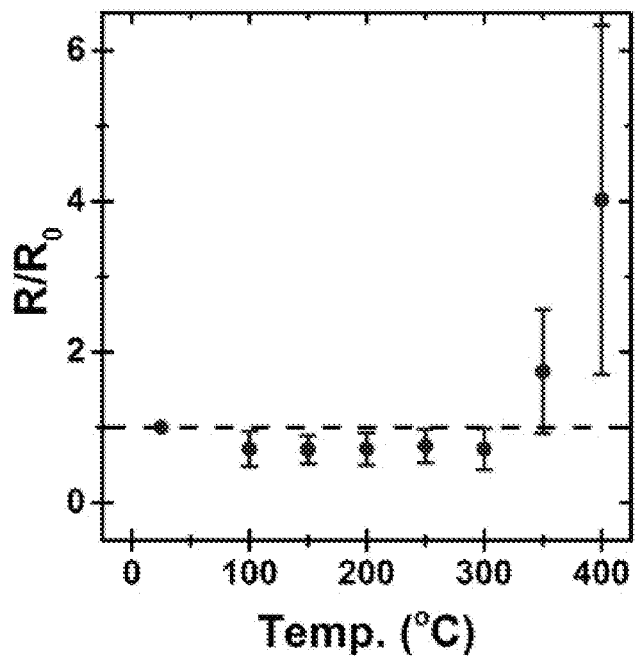

As discussed above, the stability of the graphene barrier is critical for long-term operation of liquid metal components. To determine the stability as a function of thermal stress, the silver-graphene-eGaIn junctions were exposed to progressively higher temperatures up to 400° C. As shown in FIG. 9C, the samples exhibit excellent stability to thermal exposure as high as 300° C. Following exposure to 350° C. and 400° C., an increase in resistance is measured, along with evidence for alloy formation between silver and eGaIn as observed by optical microscopy. This temperature corresponds to the annealing temperature of the graphene films prior to eGaIn deposition, and suggests that volatilization and release of polymer residue from the graphene may underlie the observed degradation by causing local build-up of stresses and eventual failure. Nevertheless, stability to 300° C. is highly advantageous for many potential applications, and opens a broad window for processing, including the possibility for integration with other materials that may require high temperature deposition or curing.

Figure 10A:
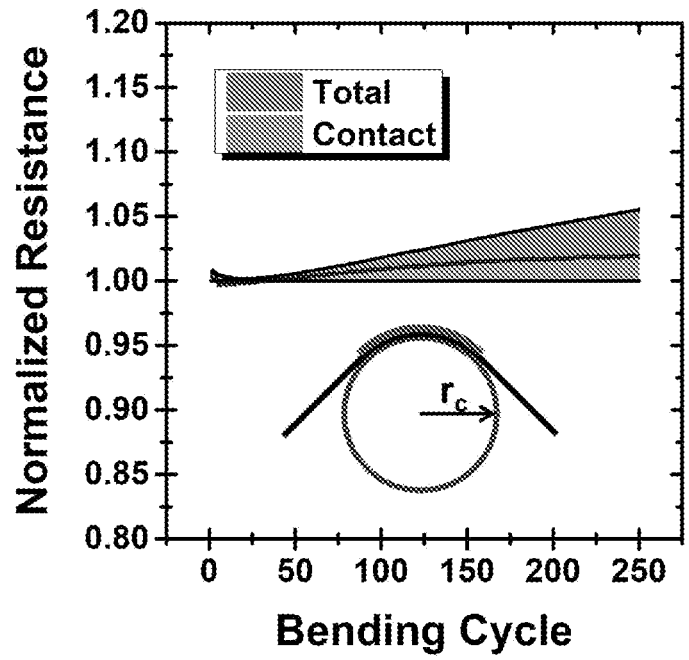
FIGS. 10A-B. (A) Normalized resistance of silver-graphene-eGaIn junctions over 250 bending cycles, with the resistance change subdivided into contact resistance associated with the eGaIn and total resistance including the silver-graphene lines.
(B) Normalized resistance of graphene eGaIn junctions over 100 bending cycles, showing stable performance.
Figure 10B:
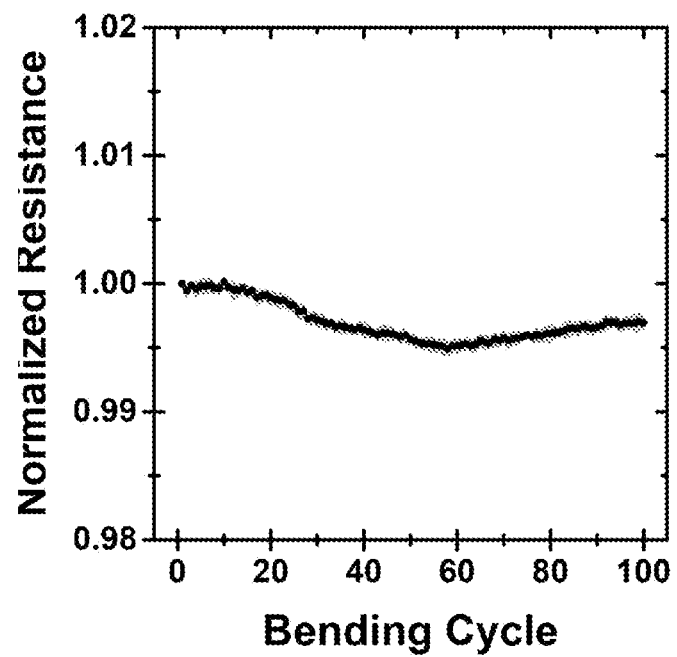

For many desirable applications of liquid metals, such as flexible circuits, mechanical resilience is also critically important. To assess this property, silver-graphene-eGaIn circuit structures were printed on polyimide substrates, and their resulting electrical properties were tested under cyclic bending. The bending test setup was provided with a motorized motion system bending the sample circuit around a cylinder with a radius of 3.2 mm. As shown in FIG. 10A, only a slight increase in resistance of ~5% was measured over 250 bending cycles, thereby confirming the mechanical integrity of the contact. This minor resistance increase is primarily associated with the silver-graphene components, with the resistance of the liquid metal contact only increasing by ~2%. The relative performance of the silver-graphene versus graphene-eGaIN interfaces is further investigated by testing a sample configuration without silver, containing only the graphene-eGaIn junction positioned directly over the center of bending. FIG. 10B shows the measurement resistance during a cyclic bending test over 100 cycles, with negligible change in resistance observed. This observation confirms the suitability of the graphene-eGaIn system for application in flexible electronics, a key focus of liquid metal development.

An additional prominent focus of liquid metal research is the development of reconfigurable electronic systems that exploit the fluid nature of the metal. A prototypical example of reconfigurability is a liquid metal switch, in which liquid metal bridges conductive electrodes to open or close a circuit. Specifically, a basic switch relies on a mobile liquid metal component in a carrier medium that makes intermittent and controllable electrical contact to fixed electrodes. To prevent oxide buildup on eGaIn and maintain fluidity, switch operation is commonly performed in a highly acidic or basic medium, which is a harsh chemical environment for metal electrodes. Moreover, given the propensity of eGaIn to rapidly alloy with metals, the long-term operation of such reconfigurable switches remains a significant challenge. Therefore, by preventing alloying between the eGaIn and fixed metal electrodes, graphene is anticipated to enable more reliable switch operation.

Figure 11A:
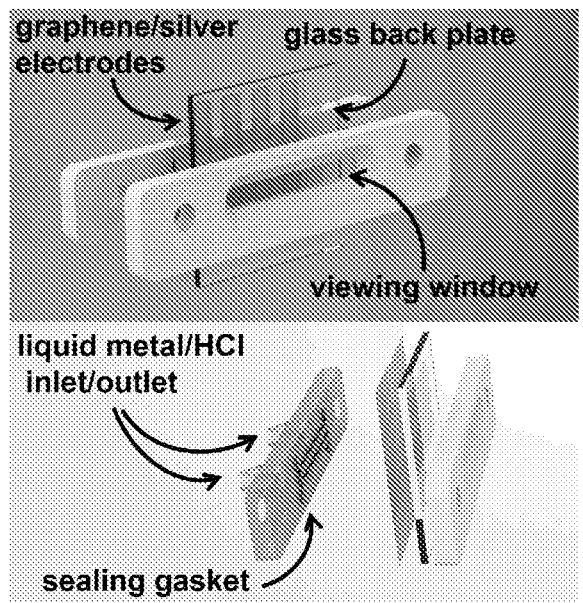
FIGS. 11A-E. Liquid metal switch design and operation. (A) Schematic illustration of the switch design, which allows controlled introduction of eGaIn in an aqueous HCl medium to pass over graphene-coated silver electrodes. (B,C) Optical images of switches with silver/graphene electrodes and uncoated silver electrodes, respectively, showing electrode damage in the case of uncoated electrodes. (D,E) Electrical characterization of the switch with graphene-coated silver electrodes, showing stable cycling with well-defined on and off states. Plots in (D) and (E) show resistance across electrodes on a linear and logarithmic scale, respectively.
Figure 11B:
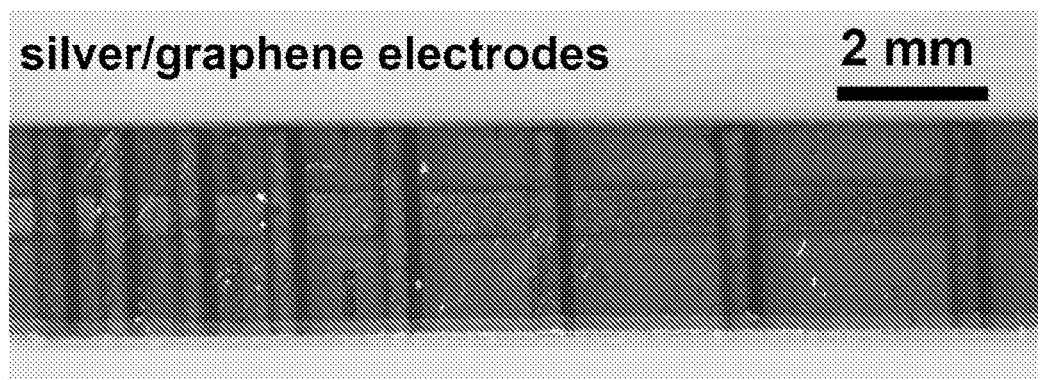
Figure 11C:
Figure 11D:
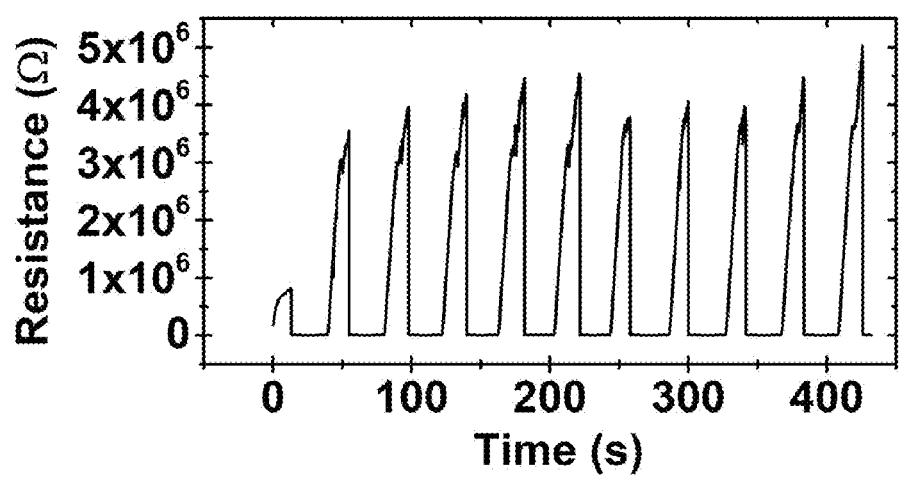
Figure 11E:
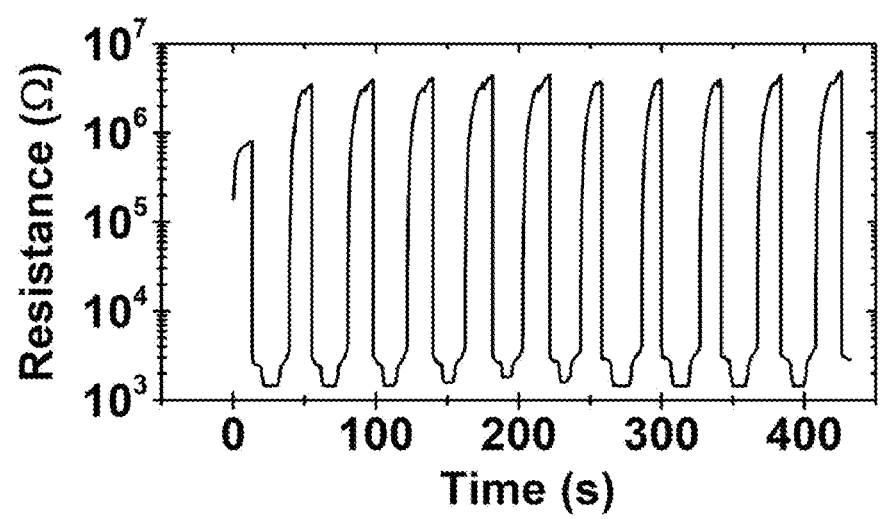

This hypothesis is tested using the switch design illustrated in FIG. 11A. In this case, electrodes comprised of silver or graphene-coated silver are printed on polyimide, while eGaIn is introduced in 2 M aqueous HCl to prevent oxide buildup and adhesion to the channel walls. The eGaIn is introduced by a syringe pump, and can span the electrodes, as shown in FIG. 11B for graphene-coated silver electrodes. For the uncoated electrodes, shown in FIG. 11C, the eGaIn alloys immediately with silver and removes several electrodes from the polyimide surface, causing irreparable damage. On the other hand, for graphene-coated electrodes, the switch achieves stable and reliable performance, as shown by electrical measurements in FIGS. 11D-E. In particular, the resistance between fixed electrodes shows a high value when liquid metal is not present, with some conduction due to the HCl electrolyte. When eGaIn contacts one electrode, an intermediate decreased resistance value is registered due to electrochemical reactions between eGaIn and HCl. However, when the liquid metal bridges the fixed electrodes to close the circuit, the resistance drops to a minimal value, which can be achieved repeatedly upon cyclic actuation of the liquid metal droplet. This result illustrates the promise of graphene as an interfacial stabilization material for reconfigurable liquid metal electronics, providing suitable chemical inertness in a harsh acidic environment.

EXAMPLES OF THE INVENTION

The following non-limiting examples and data illustrate various aspects and features relating to the articles/devices and/or methods of the present invention, including articles and devices comprising graphene components and related compositions as interfacial barriers between gallium-based liquid metal alloys and electrically-conductive metals, as are available through the fabrication techniques described herein. In comparison with the prior art, the present methods and articles/devices provide results and data which are surprising, unexpected and contrary thereto. While the utility of this invention is illustrated through the use of several articles/devices and graphene compositions/components and gallium-based alloys/components which can be used therewith, it will be understood by those skilled in the art that comparable results are obtainable with various other graphene compositions/components and gallium alloys/components, as are commensurate with the scope of this invention.

Example 1

Liquid-Phase Exfoliation and Processing of Graphene.
Graphene was produced by high shear mixing of graphite in a solution of nitrocellulose and acetone, as reported previously. (See, E. B. Secor, T. Z. Gao, A. E. Islam, R. Rao, S. G. Wallace, J. Zhu, K. W. Putz, B. Maruyama, M. C. Hersam, *Chem. Mater.* 2017, 29, 2332.) Nitrocellulose powder (NC, Scientific Polymer, Cat. #714) was dissolved in acetone at 10 mg/mL (Sigma-Aldrich, ACS Reagent Grade). Flake graphite (Asbury Graphite Mills, Grade 3061) was added at a concentration of 150 mg/mL and shear mixed with a Silverson L5M-A high shear mixer equipped with a square hole screen for 2 hours at 10,230 rpm, using an ice water bath to keep the mixture cool. The resulting mixture was centrifuged to remove unexfoliated graphite flakes at 5,000 rpm for 15 minutes followed by 6,000 rpm for 20 minutes (Beckman Coulter Avanti J-26 XPI centrifuge). The supernatant was collected and mixed with salt water (0.04 g/mL NaCl, Fisher BioReagents, in deionized water) at a ratio of ~3:1 w/w, and then centrifuged at 7,500 rpm for 6 minutes to sediment the graphene/NC composite. This composite was washed with deionized water and dried to yield a fine black powder containing graphene and NC. It should be noted that nitrocellulose with high nitrogen content is highly reactive, and thus care should be taken in handling the material to mitigate risks.

Example 2

Graphene Ink Formulation and Printing.
For inkjet printing, the graphene/nitrocellulose powder containing ~40 wt. % graphene and ~60 wt. % nitrocellulose was dispersed in a solvent system of 75:15:10 v/v ethyl lactate, octyl acetate, and ethylene glycol diacetate at a concentration of 2.1% w/v. Printing was performed with a Ceradrop X-Serie inkjet printer equipped with a Dimatix 10 pL cartridge (DMC-16110), using a custom waveform with the cartridge and substrate held at 28° C. and 35° C., respectively. Graphene thin films were prepared with a slightly modified method. In particular, a powder of graphene/ethyl cellulose (discussed in detail previously) was dispersed in ethyl lactate at a concentration of 8% w/v.

Nitrocellulose was then added at a concentration of 2% w/v. The resulting ink was directly blade-coated onto glass slides. Following printing or coating, the films were thermally annealed to remove the polymer dispersant at 250-350° C. Such graphene, graphene-cellulosic compositions and related inks can be formulated with graphene and/or cellulosic content(s) conducive for a particular application method and/or end-use. Such graphene, graphene-cellulosic ink compositions and formulations are described in U.S. Pat. No. 9,079,764 issued on Jul. 14, 2015; U.S. Pat. No. 9,834,693 issued on Dec. 5, 2017; U.S. Pat. No. 9,840,634 issued Dec. 12, 2017 and application Ser. No. 15/644,326 filed on Jul. 7, 2017—each of which is incorporated herein by reference in its entirety. In particular, graphene can comprise one or more of mono-layer, bi-layer, tri-layer and n-layer few layer graphene, where n can be 4-about 10, and/or as can be characterized by respective corresponding thickness dimension(s) as provided in the aforementioned incorporated references.

Example 3a

Liquid metal printing. Eutectic gallium-indium alloy (eGaIn) was made, using a procedure well-known to those skilled in the art, by mixing indium into liquid gallium (99.99%, Indium Corporation®, 21.4% In by weight). (T. J. Anderson, I. Ansara, *J. Phase Equilibria* 1991, 12, 64.) EGaIn was loaded into a syringe with a 250 µm ID tip and fitted to a Nordson EFD Ultimus™ V pressure pump to supply back pressure/vacuum. The syringe was fixed to an Aerotech® Gantry and printed in a shear driven process, with the print path determined by G-code scripts. Print height was controlled between 25 and 50 µm, speed between 2.5 and 7.5 mm/s, and pressure between 0.5 and 4 kPa.

Example 3b

Various other gallium liquid metal alloys can be used in conjunction with this invention, as would be understood by those skilled in the art, including those alloys with a eutectic point at about or below ambient/room temperature and/or a temperature at which the present invention can be used or practically employed. Such alloys include but are not limited to a range of gallium-indium and gallium-indium-tin alloys, as can be prepared in accordance with procedures known in the art (e.g., supra), or straight-forward modifications thereof, or are available from a number of commercial concerns including but not limited to Indium Corporation.

Example 4

Electrical Measurements.

Electrical measurements employed tungsten probes, and a four-probe measuring technique was used to remove effects of contact resistance at the probe-eGaIn interface. All measurements were performed in ambient atmosphere.

Example 5

Silver and Graphene Extrusion Printing.

To prepare samples for flexibility testing, silver and graphene were printed using the same printer setup as used for eGaIn. Silver nanoparticle ink (Advanced Nano Products DGP 40LT-15C) was printed on a temperature controlled platen at 90° C. using a 100 µm ID tip at a pressure of 5-10 kPa. Graphene ink was printed at room temperature from an identical tip at 90 kPa, and then annealed as previously specified.

Example 6

Liquid Metal Switch Demonstration.

The casing for a liquid metal switch was fabricated by 3D printing with a Stratasys Connex3 system, with the design shown in FIG. 11. Graphene-coated silver lines were printed on polyimide and loaded into the cell with a glass back plate for mechanical support. Imaging was carried out using a viewing window in the casing. A Harvard Apparatus PhD Ultra syringe pump was used to move the eGaIn and HCl through the channel at 1 µL/s, with a total stroke of 25 µL.

Example 7

Additional Characterization of Graphene as a Conductive Barrier.

Figure 2A:
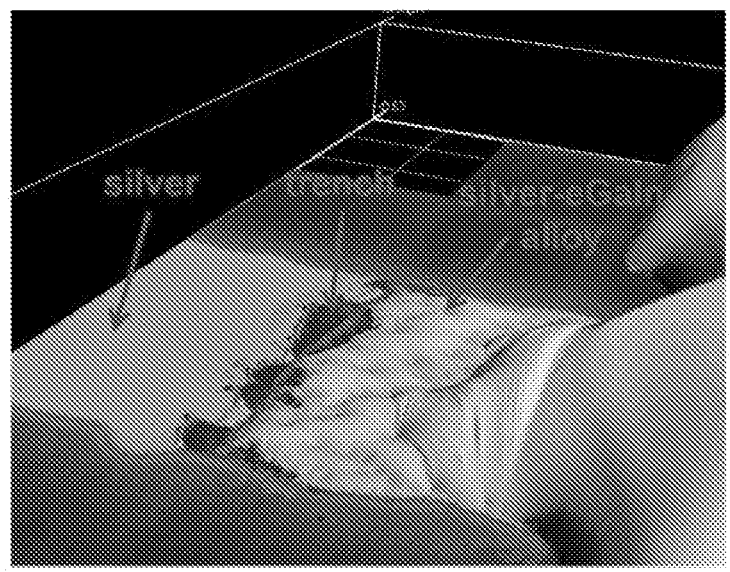
FIGS. 2A-B. Optical profilometry images of the samples shown in FIGS. 1B-C, confirming the alloy formation and severe instability of the silver-eGaIn junction (A) and passivated junction with graphene (B).
Figure 2B:
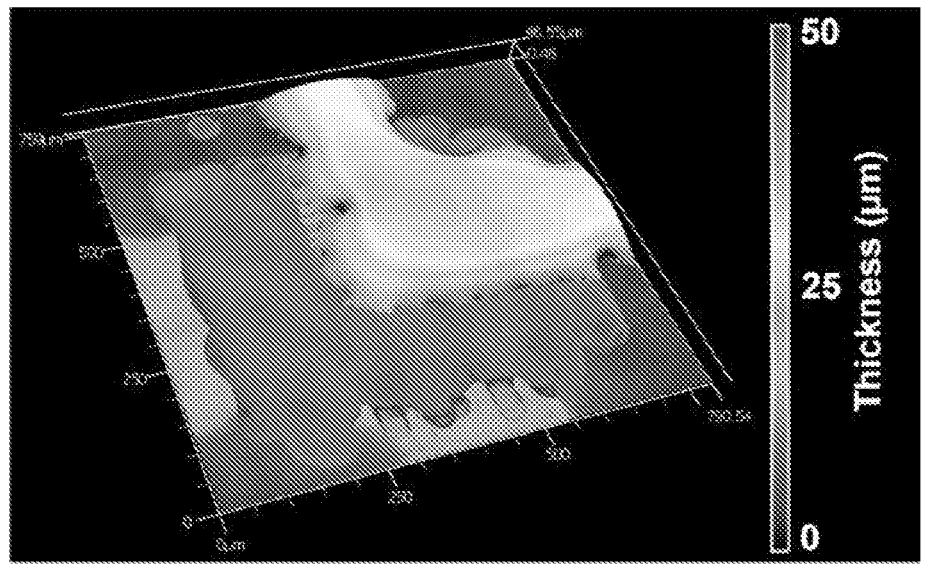

To provide additional characterization of graphene as a conductive barrier, optical profilometry was performed, as shown in FIG. 2. Silver was printed onto glass slides, and in some cases graphene was printed at select locations on the silver. Liquid metal was then printed over the top to assess the efficacy of graphene as a barrier to alloying. When graphene is not used, alloy formation between the eGaIn and silver is evident in the form of physical defects, such as a trench in the silver line, as shown in FIG. 2A. In addition, migration of gallium into the silver leads to neck formation in the eGaIn trace. When a thin (~100 nm) graphene barrier is employed, no evidence of alloy formation is observed, as shown in FIG. 2B.

Example 8a

Raman Characterization of Graphene Films.

Figure 4:
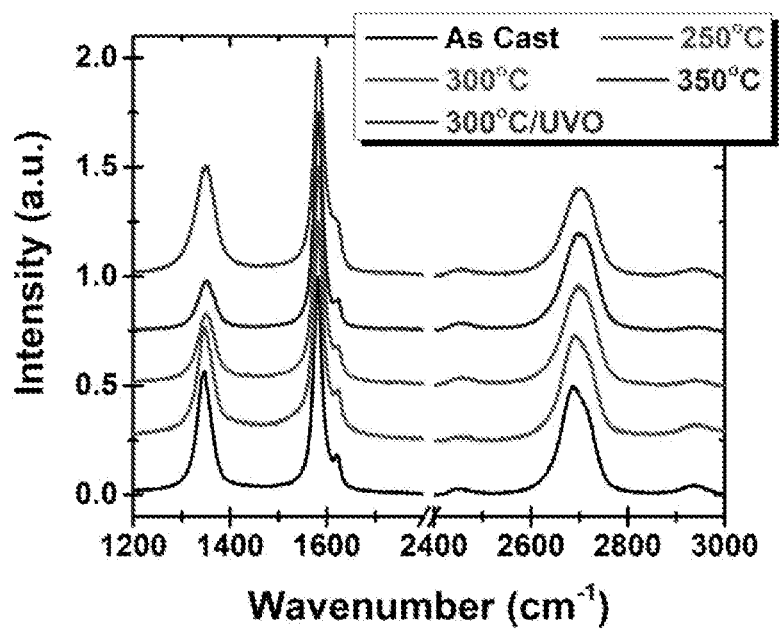
FIG. 4. Raman spectra for graphene films following various treatment conditions, including films as cast, thermally annealed at 250-350° C., and treated with UV-$O_3$ following annealing.

As shown in FIG. 3, the surface of the graphene films has a strong impact on the reliability of eGaIn printing. The surface is controlled by graphene treatment conditions, and is shown for films as cast, following thermal annealing at 250, 300, and 350° C., and following UV-$O_3$ treatment of a thermally annealed film (300° C.). In light of the contrasting eGaIn wetting/adhesion properties on these different surfaces, corresponding characterization was performed using Raman spectroscopy. Raman spectroscopy is a powerful tool for characterizing carbon nanomaterials, offering insight regarding defects, doping, structure, and strain, among other properties. Raman spectra for graphene films following these various treatment conditions are shown in FIG. 4. The well-defined G peak at ~1580 $cm^{-1}$ is indicative of good crystalline quality, in combination with the modest D peak at ~1350 $cm^{-1}$. Following thermal annealing, a reduction in the D to G peak intensity ratio (ID/IG) is observed, along with a broadening of the peaks corresponding to polymer annealation/decomposition with amorphous carbon residue, as previously observed in the literature.

Example 8b

Figure 5A:
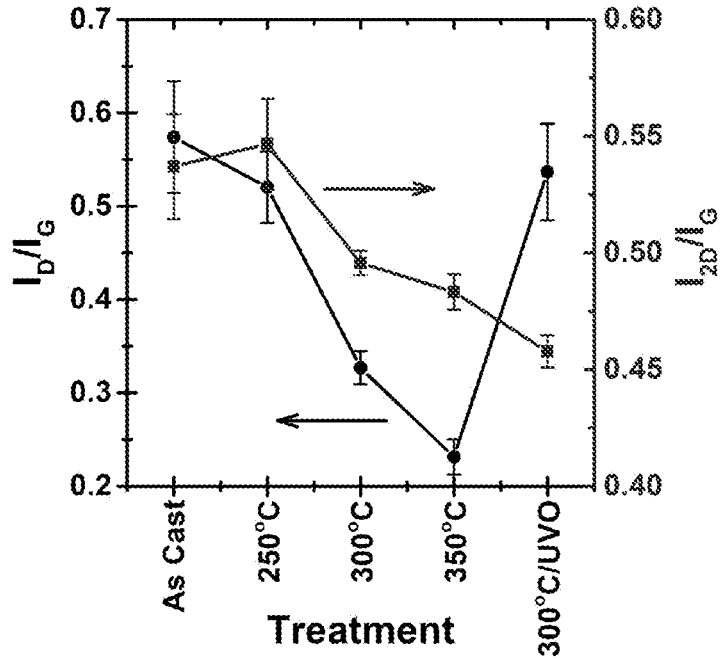
FIGS. 5A-B. Analysis of Raman spectra for graphene films following various treatment conditions. (A) D and 2D peak intensities normalized to the G band. The D-to-G peak intensity ratio is a common indicator of defect density, and shows the expected increase following oxidative treatment. (B) Peak width for the G and D bands, showing an increase upon initial annealing (polymer decomposition), a decrease with further annealing, and an increase with oxidative surface treatment.
Figure 5B:
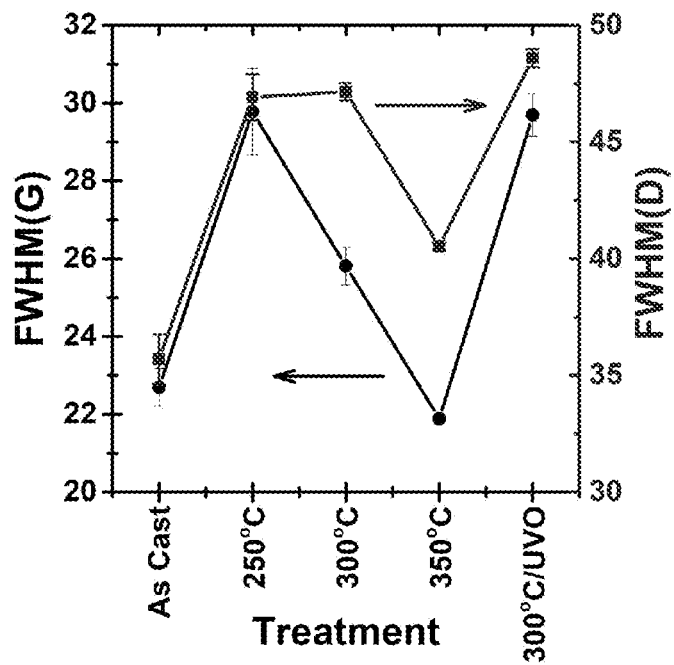

For a more quantitative comparison of the different samples, the primary peaks are fit with Lorenztian functions, and the fitted peak intensities and widths are plotted in FIG. 5. Annealing leads to a reduction in $I_D/I_G$, while oxidative UV-$O_3$ treatment leads to defect formation, causing an increase in $I_D/I_G$. Upon initial annealing at 250° C., an increase in the widths of the D and G peaks is observed, corresponding to polymer decomposition with amorphous carbon residue. As the annealing temperature is increased, the peaks become sharper, as the carbon residue is removed or altered. As seen from $I_D/I_G$, oxidative treatment leads to increased defect density and decreased crystallinity, which is further observed as an increase in the width of the D and G peaks.

Example 9

Water Contact Angle for Graphene Films.

Figure 6:
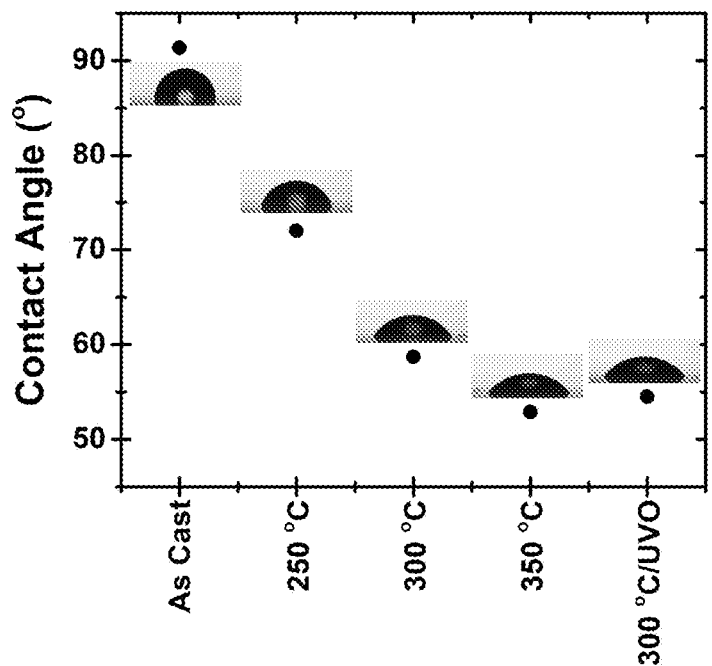
FIG. 6. Water contact angle measurements on graphene films following various treatment conditions, showing a change in wettability resulting from the processing conditions.

Due to the different wetting/adhesion properties observed for eGaIn printed onto graphene films following various treatments, water contact angle measurements were performed to better understand this effect. The water contact angle was measured using the sessile drop method, and the results are shown in FIG. 6.

Example 10

Aspect Ratio Analysis for eGaIn Lines on Unoptimized Graphene Surfaces.

Figure 7:
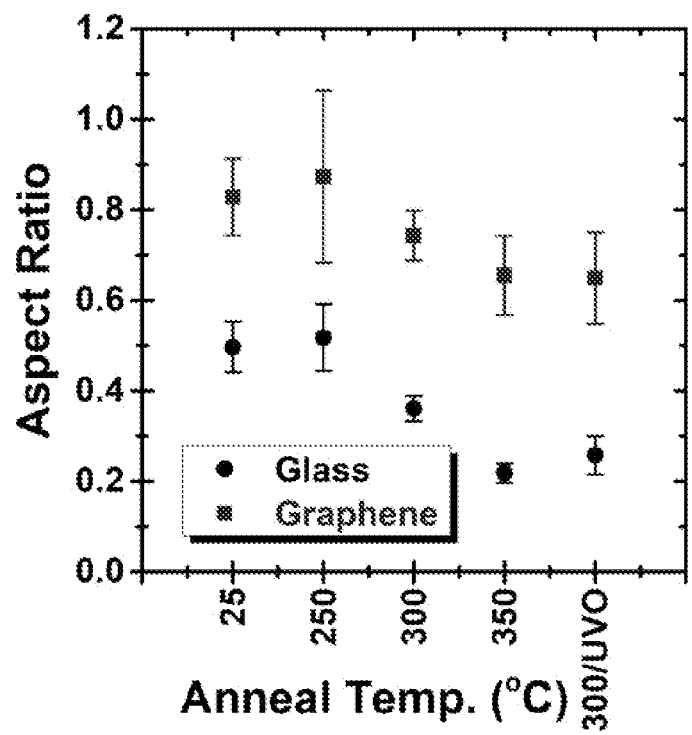
FIG. 7. Aspect ratio of eGaIn lines printed on glass and graphene surfaces following various treatments. Thermal annealing conditions (250-350° C.) are presented in FIG. 8, while all treatment conditions are presented here.

FIG. 3 presents an analysis of the aspect ratio of eGaIn lines on glass and graphene surfaces following thermal annealing, for which reliable printing was realized. The analysis including graphene surfaces as cast and following UV-$O_3$ treatment is shown in FIG. 7, indicating that the eGaIn morphology, while varying consistently with thermal annealing conditions, does not exhibit a one-to-one correlation with proper surface condition for reliable wetting/adhesion.

Example 11

Work Function of Graphene Films.

FIG. 9 examines the electrical properties of junctions between the different conductive materials. One factor influencing contact resistance is the metal work function, with work function alignment favored for low-resistance electrical connections. To assess the electrical properties of the graphene surface, the work function was measured by Kelvin probe methods, with the results shown in FIG. 8.

As discussed above, printable graphene inks have been demonstrated as a high-performance, reliable interfacial material to enable stable electrical connections between conventional and liquid metals. In this context, the thin nature, dense film formation, high electrical conductivity, and robust chemical, thermal, and mechanical stability of graphene offer key benefits. Moreover, broad process compatibility with liquid-phase printing methods suggests promise for widespread use in both fundamental research studies and practical applications. A thin (~100 nm) film of printed graphene was shown to effectively suppress alloy formation between eGaIn and silver, while maintaining desirable electrical performance and excellent thermal, mechanical, and chemical durability. This advance was further leveraged to realize a liquid metal-based reconfigurable device with improved operational stability. Overall, this work demonstrates a promising solution to a well-established challenge in the development of liquid metal electronics, offering a compelling strategy for a wide range of emerging printed, flexible, and reconfigurable electronic applications.

We claim:

1. An article of manufacture comprising a gallium liquid metal alloy component coupled to a graphene component comprising at least one of a cellulosic dispersing agent and an annealation product thereof.

2. The article of claim 1 wherein said cellulosic dispersing agent is selected from ethyl cellulose and nitrocellulose dispersing agents.

3. The article of claim 1 wherein said gallium alloy component comprises gallium and indium.

4. The article of claim 3 wherein said gallium alloy component is a eutectic gallium-indium liquid metal alloy.

5. The article of claim 1 comprising a metallic component coupled to said gallium liquid metal alloy component with said graphene component.

6. The article of claim 5 wherein said metallic component is an electrically-conductive metal.

7. The article of claim 6 wherein said metal is silver.

8. The article of claim 1 incorporated into an electrical device comprising a silver metal configured to provide an electrical circuit.

9. An electronic device comprising an electrically-conductive metal component coupled to a substrate, a nanodimensioned gallium-indium liquid metal alloy component coupled to said metal component with a nanodimensioned graphene component, said graphene component comprising at least one of a cellulosic dispersing agent and an annealation product thereof.

10. The device of claim 9 wherein said cellulosic dispersing agent is selected from ethyl cellulose and nitrocellulose dispersing agents.

11. The device of claim 9 wherein said gallium-indium component is a eutectic gallium-indium liquid metal alloy.

12. The device of claim 9 wherein said metal is silver.

13. The device of claim 12 wherein said silver metal is configured to provide an electrical circuit.

14. The device of claim 9 wherein said substrate is flexible.

15. The device of claim 14 wherein said substrate comprises a polyimide.

16. A reconfigurable electronic device comprising a liquid metal circuit switch, said switch comprising:
opposed metal electrodes coupled to a substrate, said electrodes having a voltage thereacross; and
a mobile gallium-indium liquid metal alloy component configured between and coupled to at least one said electrode with a graphene component comprising at least one of a cellulosic dispersing agent and an annealation product thereof,
whereby configuration of said metal alloy component contacts one said electrode and opens a circuit between said electrodes; and whereby reconfiguration of said metal alloy component contacts both said electrodes and closes a circuit therebetween.

17. The device of claim 16 wherein said cellulosic dispersing agent is selected from ethyl cellulose and nitrocellulose dispersing agents.

18. The device of claim 16 wherein said gallium-indium component is a eutectic gallium-indium liquid metal alloy.

19. The device of claim 16 wherein said electrodes comprise silver.

20. The device of claim 16 wherein said substrate is flexible.

21. The device of claim 20 wherein said substrate comprises a polyimide.

22. A method of using a graphene composition to facilitate stable electrical connection with a gallium liquid metal alloy, said method comprising:
providing a substrate having an electrically-conductive metal component coupled thereto;
contacting a graphene composition with said metal component to provide a metal-graphene junction, said graphene composition comprising graphene and at least one of a cellulosic dispersing agent and an annealation product thereof; and contacting a gallium liquid metal alloy with said graphene composition to provide a graphene-gallium alloy junction, said graphene composition providing an electrically-conductive component between said metal and said gallium liquid metal alloy, thereby modulating alloy formation with said metal component.

23. The method of claim 22 wherein said graphene component is annealed.

24. The method of claim 23 wherein said component is annealed at a temperature of about 250° C.-about 350° C.

25. The method of claim 24 wherein said gallium liquid metal alloy comprises a line configuration, and the aspect ratio of said alloy line decreases with increasing annealation temperature.

26. The method of claim 22 wherein said metal is silver.

27. The method of claim 26 wherein said alloy comprises gallium and indium.

28. The method of claim 27 wherein said alloy is a eutectic gallium-indium liquid metal alloy.

29. The method of claim 28 whereby the resistance of said silver-graphene-eutectic gallium-indium junction is less than the resistance of a silver-graphene junction or the resistance of a graphene-eutectic gallium-indium junction.

30. The method of claim 22 wherein said graphene composition is a graphene ink comprising a dispersing agent selected from an ethyl cellulose and a nitrocellulose.

31. The method of claim 30 wherein said contact is selected from inkjet printing, screen printing, aerosol jet printing, gravure printing and blade-coating.

* * * * *